United States Patent [19]

Herzog

[11] Patent Number: 4,739,515
[45] Date of Patent: Apr. 19, 1988

[54] VOLTAGE STANDING WAVE RATIO BRIDGE MEASURING CIRCUIT

[75] Inventor: William E. Herzog, Rochester, N.Y.

[73] Assignee: Harris Corporation, Melbourne, Fla.

[21] Appl. No.: 780,812

[22] Filed: Sep. 27, 1985

[51] Int. Cl.⁴ .................. H03C 1/62; H04B 17/00
[52] U.S. Cl. .............................. 455/115; 324/58 B; 455/67
[58] Field of Search ........... 324/58 B, 58 R, 57 R; 455/115, 67

[56] References Cited

U.S. PATENT DOCUMENTS

| | | | |
|---|---|---|---|
| 2,588,390 | 3/1952 | Jones | 324/58 B |
| 2,734,169 | 2/1956 | Douma | 324/58 B |
| 2,797,387 | 6/1957 | Adams et al. | 324/58 B |
| 2,808,566 | 10/1957 | Douma | 324/58 B |
| 3,020,529 | 2/1962 | Turner | 324/58 B X |
| 3,145,338 | 8/1964 | Downs | 324/58 B |
| 3,683,274 | 8/1972 | Martin | 324/58 R |
| 4,075,554 | 2/1978 | Mecklenburg | 324/58 B |
| 4,110,685 | 8/1978 | Leenerts | 324/58 B |

*Primary Examiner*—Reinhard J. Eisenzopf
*Assistant Examiner*—Jose M. Solis
*Attorney, Agent, or Firm*—L. Lawton Rogers, III; Joseph M. Killeen

[57] ABSTRACT

A method and apparatus for measuring the voltage standing wave ratio on a radio frequency transmission line. The bandwidth of radio frequency signals over which the apparatus accurately operates is improved by the use of a filter to unload terminating resistors at low frequencies and by the use of an inductive element in the measuring circuit to compensate for phase lag induced by elements of the measuring circuit.

16 Claims, 1 Drawing Sheet

VOLTAGE STANDING WAVE RATIO BRIDGE MEASURING CIRCUIT

BACKGROUND OF THE INVENTION

The present invention relates generally to high frequency signal measuring systems and more particularly to an apparatus and method for measuring the voltage standing wave ratio on a radio frequency transmission line.

Sometimes a portion of the energy of a signal being transmitted along a radio frequency (RF) conductor in an RF transmission circuit is reflected back along the conductor by disturbances in the circuit. These disturbances often occur when an RF conductor, or transmission line, is terminated, such as at a transmitting antenna or at other types of transmission line junctions.

When a reflected signal is present, the voltage on an RF transmission line can be considered to have two components, an incident voltage $E_i$ and a reflected voltage $E_r$. Similarly, the current can be considered to have two components, the incident current $I_i$ and the reflected current $I_r$.

The efficiency of an RF transmission system can be determined by comparing the incident voltage $E_i$ with the reflected voltage $E_r$. A direct comparison of these parameters is the reflection coefficient: $p = E_r / E_i$. A customary measure of efficiency of RF transmission circuits is the voltage standing wave ratio (VSWR), which is defined by the expression $VSWR = (1+p)/(1-p)$.

When reflected signals are present on a transmission line, the resultant signal may be considered the vector sum of the forward or incident signal and the backward or reflected signal. If the reflected signal has an amplitude of appreciable amplitude relative to the forward signal, the resultant signal can differ considerably from the signal which was applied to the transmission line, i.e., the forward signal. Because the reflected signal can distort the forward signal, it is often desireable to measure the resultant signal so that adjustments may be made to the transmission circuit to reduce or compensate for the disturbances causing the reflected wave.

Various instruments have been devised to measure the resultant signal and/or its component signals. Conventional watt meters, for example, may be used to measure the average power in the resultant signal, if the forward signal has a sufficiently low frequency. It is also known to utilize directional devices which extract a fraction of the power associated with only one of the signals, either incident or reflected, while, ideally, being unaffected by the signal in opposite direction. It is also known to combine two directional devices in a single device so that a measure of net power delivered by the resultant signal to an arbitrary load may be measured.

One form of apparatus for measuring the relative magnitude of the incident and reflected voltages, shown in U.S. Pat. No. 3,683,274, derives a sample voltage proportional to the transmission line voltage and utilizes a current transformer to induce a voltage proportional to the current in the transmission line. The induced voltage is then divided into two equal voltages, one of which is added to the sample voltage while the other is subtracted from the sample voltage.

The sum voltage is proportional to the transmission line's incident voltage and the difference voltage is proportional to the reflected voltage. Through the appropriate conventional circuitry, the sum and difference voltages may be manipulated to derive the reflection coefficient or VSWR. Examples of VSWR measurement instruments which manipulate these types of the sum and difference voltages may be found U.S. Pat. Nos. 3,020,529 and 4,110,685.

Current transformers, which are used to derive the induced voltage, typically have several drawbacks that limit the accuracy of the measurement of the sum and difference voltages. For example, at low frequencies the current transformer may cause a phase shift of unknown magnitude. The current induced in a current transformer leads the induced voltage by a phase of 90°, and the inductive reactance of the transformer's secondary winding causes a further phase shift of almost 90°. The difference between this total phase shift and 180°, represents an error of generally unknown magnitude.

Another drawback with typical current transformers, one that is accentuated at high frequencies, stems from the transmission line effects of the current transformer's secondary winding. These effects cause a phase delay between the transformer's output and its input, which causes error in a measuring device using a current transformer. These two drawbacks combine to limit the frequency bandwidth over which the measuring device may be used accurately.

The present invention is intended to overcome the above-mentioned disadvantages in the prior art.

It is accordingly an object of this invention to provide a novel method and apparatus for compensating for high frequency phase delay in a circuit for measuring the incident and reflected wave magnitudes on an RF transmission line.

It is another object of this invention to provide a novel method and apparatus for compensating for low frequency phase shift in a circuit for measuring the incident and reflected wave magnitudes on an RF transmission line.

It is still another object of the present invention to provide a novel method and apparatus for increasing the frequency bandwidth over which the incident and reflected wave magnitudes on a RF transmission line may be measured.

These and many other objects and advantages of the present invention will be apparent to one skilled in the art from the claims and from the following detailed description when read in conjunction with the appended drawings.

THE DRAWINGS

DETAILED DESCRIPTION OF THE PREFERRED EMBODIMENT

Figure 1:
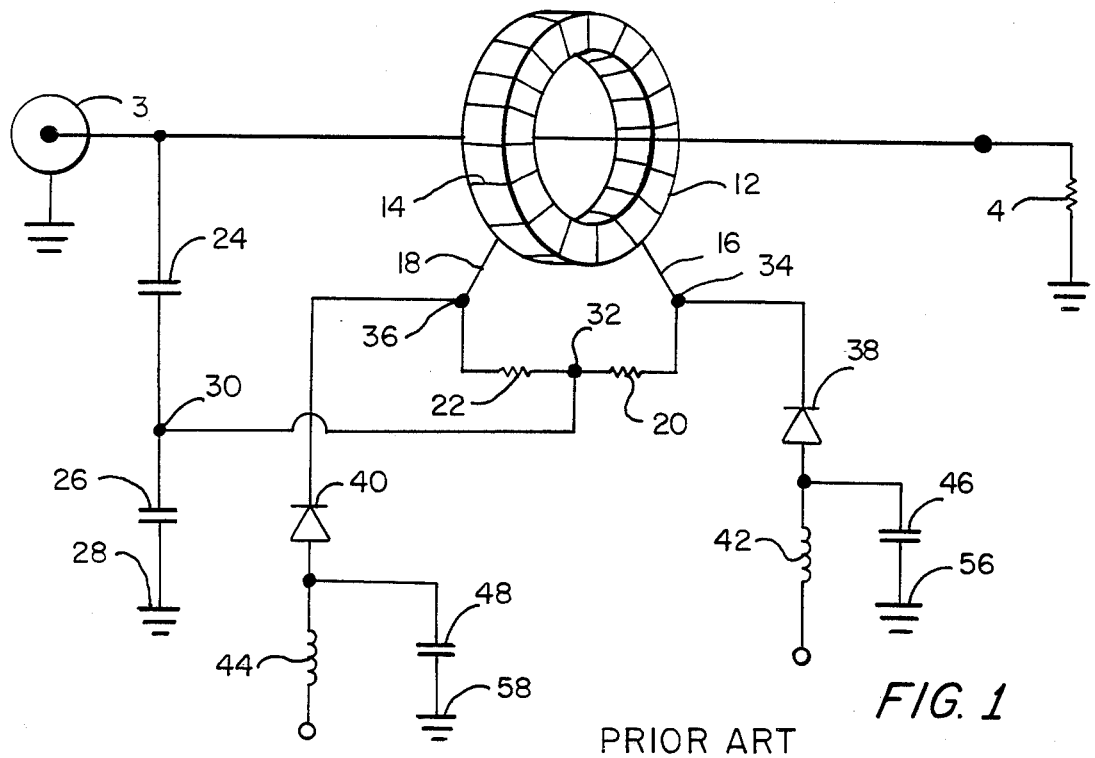
FIG. 1 is a schematic circuit diagram of a prior art VSWR measuring apparatus.

A measuring circuit of the prior art is shown in FIG. 1. With reference to FIG. 1, a transmitter (not shown) generates an RF signal which is conveyed on a transmission line 3 to a resistive load 4, such as an antenna. A torodial current transformer 12 is arranged around the transmission line 3 and has a secondary winding 14 toroidally wound therearound. Two lead wires 16 and 18 of the secondary winding 14 are connected by a serially connected pair of terminating resistors 20 and 22. The resistors 20 and 22 are of equal resistance. The transmission line 3 is connected to a reference ground 28 by a pair of serially connected impedances first and second 24 and 26, which may be two capacitors as shown, or two resistors. A junction 30 between the impedances 24 and 26 is connected to a junction 32 between the resistors 20 and 22.

In operation, the current transformer 12 induces a current in the secondary winding 14 from and proportional to the current of the signal in the transmission line 3. The induced current in the secondary winding 14 causes induced voltage across each of the first and second terminating resistors 20 and 22. Both the induced current and induced voltage across the terminating resistors 20 and 22 are related to the signal appearing on the transmission line 3.

With continued reference to FIG. 1, the voltage of the signal in the transmission line 3 is divided by the two impedances 24 and 26 to provide a sample voltage at the impedance junction 30. The amount of impedance at each of the impedances 24 and 26 may be selected so that the voltage across the impedance 26 is related to the induced voltage across the resistors 20 and 22 and so that the circuit has a relatively small influence on the signal on the transmission line 3. For example, if the first impedance 24 is small relative to the second impedance 26, a high percentage of the loading voltage will be developed across the second impedance 26. Such an arrangement keeps the capacitance reactance shunted across the load at a high level so that the circuit has little effect on the standing wave ratio being measured.

When the impedance junction 30 is conductively connected to the resistor junction 32, a sum voltage equal to the induced voltage across resistor 20 added to the sample voltage, is obtained between the resistor 20 and ground reference. Similarly, a difference voltage, equal to the induced voltage drop across resistor 22 subtracted from the sample voltage is obtained between the resistor 22 and ground. The sum voltage is proportional to the transmission line's incident voltage, while the difference voltage is proportional to the reflected voltage. The sum and difference voltages may be measured in a conventional manner, as illustrated across a diode protected inductor, and may be compared or further modified to yield the desired type of output.

In the VSWR circuit shown in FIG. 1, the junctions 34 and 36 between the terminating resistors 20 and 22 and leads 16 and 18 are connected to identical detection circuits comprising rectifying diodes 38 and 40 serially connected to a parallel connection of a coil 42 and 44 and filter capacitors 46 and 48. The filter capacitors 46 and 48 are connected to reference grounds 56 and 58 and the coils 42 and 44 are connected to output terminals 43 and 45.

Figure 2:
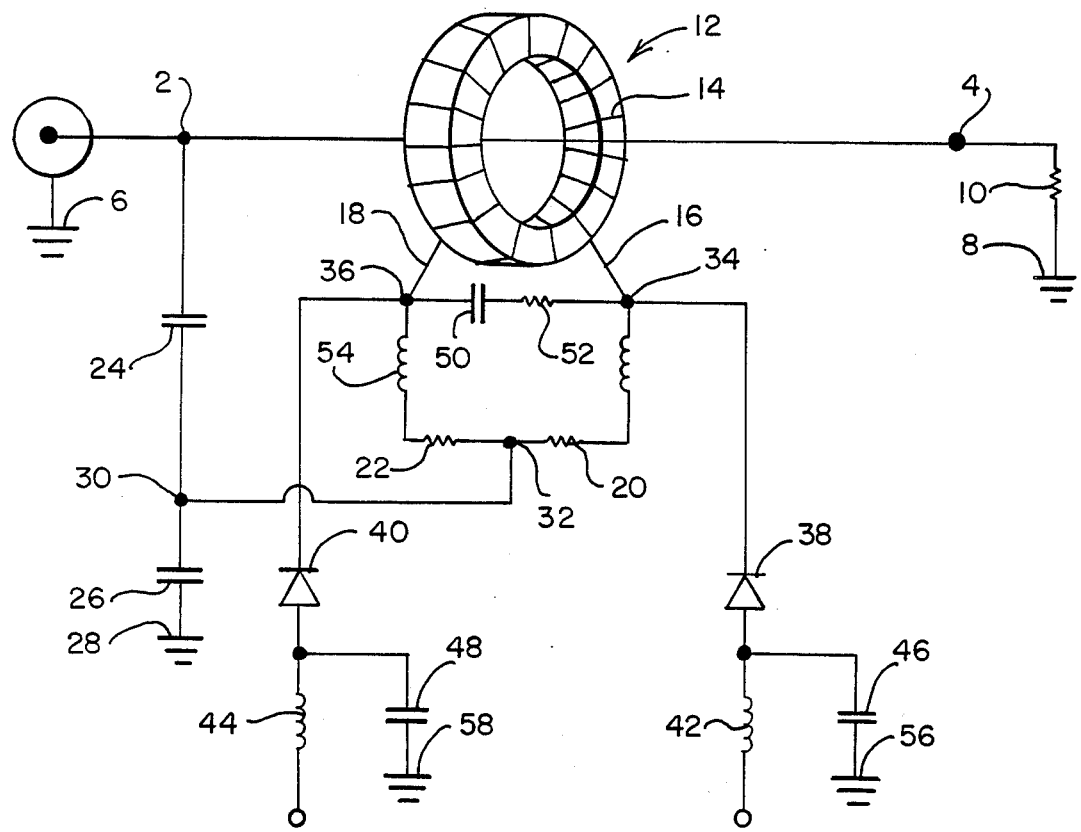
FIG. 2 is a schematic circuit diagram of a VSWR measuring apparatus of the present invention.

With reference to FIG. 2, wherein like elements are given like reference numerals to those utilized in FIG. 1, a VSWR circuit of the present invention permits accurate use of the measuring circuit over a wider band of signal frequencies than in typical prior art devices. An RF signal is conveyed along a transmission line 3 to a resistive load 4. A toroidial current transformer 12 is arranged around the transmission line 3 such that the winding 14 of the transformer 12 is toroidally wound around the transmission line 3. Two lead wires 16 and 18 of the winding 14 are connected by a serially connected pair of first and second terminating resistors 20 and 22. The resistors 20 and 22 are of equal resistance.

The transmission line 3 is connected to a reference ground 28 by a pair of serially connected impedances 24 and 26. A junction between the impedances 24 and 26 is connected to a junction 32 between the resistors 20 and 22.

A resistor 52 and capacitor 50 are serially connected across the junctions 34 and 36 between the terminating resistors 20 and 22 and the winding leads 16 and 18.

An inductor 54 is connected between the first resistor 20 and the junction 34 with winding lead 16.

In operation, the winding 14 of the transformer 12 operates as a secondary winding of a transformer, the transmission line 3 being the primary winding. The current of the signal induced in the winding 14 is related in a known manner to the current in the signal on the transmission line 3 and causes an induced voltage across the terminating resistors 20 and 22.

The purpose of the transformer 12 is to measure the current in the transmission line 3 and, accordingly, many conventional current transformers could be used in place of the toroidally wound transformer 12 illustrated in FIG. 2.

With continued reference to FIG. 2, the two impedances 24 and 26 serve as a voltage divider of the voltage of the signal appearing on the transmission line 3. Depending uppon the value of the impedances 24 and 26, which may be capacitors, resistors or other impedance elements, a sample voltage, related to the transmission line voltage, is obtained at the impedance junction. Because of the conductive connection between the impedance junction 30 and the resistor junction 32, the voltage appearing at the first resistor 20 is the sum of the sample voltage and the induced voltage and the voltage appearing across the second resistor 22 is the difference between the sample voltage and the induced voltage. The sum voltage is related to the voltage of the forward signal and the difference voltage is related to the voltage of the reflected signal. Both the forward and reflected voltages may be detected by conventional circuitry such as that provided in the circuit of FIG. 2.

At relatively low frequencies, the inductance of the secondary winding 14 causes an indeterminate error in conventional VSWR measuring circuits. The magnetic field generated by the primary winding of the transformer 12 is directly in phase with the primary current. With the typical sine wave currents of RF signals, the phase of the induced voltage is at a maximum when the primary current is going thorough the zero; thus, there is a 90 degree phase shift between the induced voltage and the primary current. Conventionally, this relationship between current and voltage is referred to as the current leading the induced voltage by 90 degrees.

There is a further phase shift, between the induced voltage and the voltage across the terminating resistors 20 and 22 caused by the inductive reactance and the resistance of the winding 14. While the further phase shift is ideally 90 degrees, in practice an error in the phase shift, related to the ratio of the reactances of the winding 14 to the terminating resistance, is usually present. The circuit of the present invention recognizes the error in the phase shift and compensates for it by use of the serially-connected resistor 52 and capacitor 50. The resistor 52 and capacitor 50 act as a low-pass filter to unload the terminating resistors 20 and 22 at low frequencies and add capactive reactance. This reactance compensates for the error in the phase shift of the transformer 12.

All transformers have a phase delay between its output and input because of transmission line effects in its windings. The phase delay is oft related to the length of the windings used in the transformer and can severally restrict the frequency band-width over which the transformer can be used in a measuring instrument. Prior art circuits strove to reduce the inductance of the terminating resistors 20 and 22.

In contrast to the prior art, a circuit of the present invention may correct for the transformer's phase delay by adding the inductor 54 in series with the first terminating resistor 22. With the addition of the inductor 54 to the circuit, the current-sample voltage seen by the detector diode 40 is not only the transformer's secondary winding current through its terminating resistor 20 but also has an additional leading component caused by the inductor 54. The voltage across the inductor 54 leads the current through the inductor 54 and thereby shifts the phase of the current sample sufficiently to compensate for the phase delay of the transformer 12.

These and other advantages of the present invention will be readily apparent to one skilled in the art from the claims. It should be understood that the foregoing description of the preferred embodiments is illustrative only, that many modifications may be made without departing from the spirit thereof as defined in the claims when accorded a full range of equivalents.

What is claimed is:

1. A VSWR bridge circuit, comprising:
   a current transformer having a secondary winding;
   first and second terminating resistances serially connected across the secondary winding; and
   means for unloading said terminating resistances at low frequencies and substituting a slight capacitive load.

2. A VSWR bridge circuit as described in claim 1 wherein said unloading means comprises a low-pass R-C filter shunting said first and second resistances.

3. In a bridge circuit for measuring the voltage standing wave ratio on a radio frequency transmission line, said circuit comprising:
   (a) a toroidal current transformer having a torodially wound secondary winding arranged around the transmission line, for inducing a voltage in said secondary winding proportional to the current in the transmission line;
   (b) first and second serially connected resistors connected between each end of said secondary winding, the resistance of each resistor being substantially equal, for dividing the induced voltage into two equal further voltages proportional to the current in the transmission line;
   (c) first and second serially connected impedances connected between the transmission line and a ground reference to derive a sample voltage at a point between said impedances, said sample voltage being related to the voltage of the transmission line; and
   (d) a conductive connection between the junctions of said first and second impedances and said first and second resistors, so that the voltage at the connector between said first resistor and said winding is the sum of the sample voltage and one of said further voltages and the voltage at the connection between said second resistor and said winding is the difference between the sample voltage and the other of said further voltages, the first voltage sum being proportional to the incident voltage and the second voltage sum being proportional to the reflected voltage,
   the improvement comprising:
   (e) an inductance serially connected between said first resistor and said secondary winding to compensate for the high frequency phase delay of said transformer thereby to increase the frequency bandwidth over which the voltage standing wave ratio may be measured.

4. In a circuit for sampling voltages proportional to the incident and reflected voltages on a radio frequency transmission line, said circuit comprising:
   (a) a toroidal current transformer having a torodially wound secondary winding arranged around the transmission line, for inducing a voltage in aid secondary winding proportional to the current in the transmission line;
   (b) first and second serially connected resistors connected between each end of said secondary winding, the resistance of each resistor being substantially equal, for dividing the induced voltage into two equal further voltages proportional to the current in the transmission line;
   (c) first and second serially connected impedances connected between the transmission line and a ground reference to derive a sample voltage at a point between said impedances, said sample voltage being related to the voltage of the transmission line,
   (d) a conductive connection between the junctions of said first and second impedances and said first and second resistors, so that the voltage at the connector between said first resistor and said winding is the sum of the sample voltage and one of said further voltages and the voltage at the connection between said second resistor and said winding is the difference between the sample voltage and the other of said further voltages, the first voltage sum being proportional to the incident voltage and the second voltage sum being proportional to the reflected voltage, and
   the improvement comprising:
   (e) a serially connected resistance and capacitance connected across the first and second resistor for unloading said first and second resistors at low frequencies and adding capacitive reactance in an amount to compensate for the phase lag between the current and the induced voltage at said first and second resistors due to the transformer's lack of inductance and core loss thereby to increase the frequency bandwidth over which the proportional voltages may be sampled.

5. In a circuit for sampling voltages proportional to the incident and reflected voltages on a radio frequency transmission line, said circuit comprising:
   (a) a toroidal current transformer having a torodially wound secondary winding arranged around the transmission line, for inducing a voltage in aid secondary winding proportional to the current in the transmission line;
   (b) first and second serially connected resistors connected between each end of said secondary winding, the resistance of each resistor being substantially equal, for dividing the induced voltage into two equal further voltages proportional to the current in the transmission line;
   (c) first and second serially connected impedances connected between the transmission line and a ground reference to derive a sample voltage at a point between said impedances, said sample voltage being related to the voltage of the transmission line, (d) a conductive connection between the junctions of said first and second impedances and said first and second resistors, so that the voltage at the connector between said first resistor and said winding is the sum of the sample voltage and one of said further voltages and the voltage at the connection between said second resistor and said winding is the difference between the sample voltage and the other of said further voltages, the first voltage sum being proportional to the incident voltage and the second voltage sum being proportional to the reflected voltage, and the improvement comprising:

(e) an inductance serially connected between said first resistor and said secondary winding to compensate for the high frequency phase delay of the transformer thereby to increase the frequency bandwidth over which the proportional voltages may be sampled.

6. In a bridge circuit for measuring the voltage standing wave ratio on a radio frequency transmission line, said circuit comprising:

(a) a torodial current transformer having a torodially wound secondary winding arranged around the transmission line, for inducing a voltage in said secondary winding proportional to the current in the transmission line;

(b) first and second serially connected resistors connected between each end of said secondary winding, the resistance of each resistor being substantially equal, for dividing the induced voltage into two equal further voltages proportional to the current in the transmission line;

(c) first and second serially connected impedances connected between the transmission line and a ground reference to derive a sample voltage at a point between said impedances, said sample voltage being related to the voltage of the transmission line;

(d) a conductive connection between the junctions of said first and second impedances and said first and second resistors, so that the voltage at the connector between said first resistor and said winding is the sum of the sample voltage and one of said further voltages and the voltage at the connection between said second resistor and said winding is the difference between the sample voltage and the other of said further voltages, the voltage sum being proportional to the incident voltage and the voltage difference being proportional to the reflected voltage; and (e) first and second measuring circuit branches, each connected from different ends of said winding to a ground reference for deriving a measurement of the voltage standing wave ratio from said voltage sum and difference;

the improvement comprising:

(f) a serially connected resistance and capacitance connected across said first and second resistors for unloading said first and second resistances at low frequencies and adding capacitive reactance in an amount to compensate for the phase lag between the current and the induced voltage at said first and second resistor due to the transformer's lack of inductance and core loss; and (g) an inductance serially connected between said first resistor and said secondary winding to compensate for the high frequency phase delay of said transformer;

thereby to increase the frequency bandwidth over which the voltage standing wave ratio may be measured.

7. In a bridge circuit for measuring the voltage standing wave ratio on a radio frequency transmission line, said circuit comprising:

(a) a toroidal current transformer having a torodially wound secondary winding arranged around the transmission line, for inducing a voltage in said secondary winding proportional to the current in the transmission line;

(b) first and second serially connected resistors connected between each end of said secondary winding, the resistance of each resistor being substantially equal, for dividing the induced voltage into two equal further voltages proportional to the current in the transmission line;

(c) first and second serially connected impedances connected between the transmission line and a ground reference to derive a sample voltage at a point between said impedances, said sample voltage being related to the voltage of the transmission line; and (d) a conductive connection between the junctions of said first and second impedances and said first and second resistors, so that the voltage at the connector between said first resistor and said winding is the sum of the sample voltage and one of said further voltages and the voltage at the connection between said second resistor and said winding is the difference between the sample voltage and the other of said further voltages, the first voltage sum being proportional to the incident voltage and the second voltage sum being proportional to the reflected voltage, the improvement comprising:

(e) a serially connected resistance and capacitance connected across said first and second resistor for unloading said first and second resistances at low frequencies and adding capacitive reactance in an amount to compensate for the phase lag between the current and the induced voltage at said first and second resistor due to the transformer's lack of inductance and core loss, thereby to increase the frequency bandwidth over which the voltage standing wave ratio may be measured.

8. A VSWR bridge circuit, comprising:

a current transformer having a secondary winding with first and second ends;

first and second terminating resistances serially connected between said first and second ends; and an inductance connected between said first terminating resistance and said first end of the secondary winding.

9. A bridge circuit for measuring the voltage standing wave ration on a radio frequency transmission line, said circuit comprising:

means for obtaining a sample voltage proportional to the voltage in the transmission line;

means for inducing a voltage proportional to the current in the transmission line;

voltage dividing means for deriving two equal further voltages proportional to the current in the transmission line;

means for obtaining a sum voltage equal to the sum of the sample voltage and said further voltage, said sum voltage being proportional to the incident voltage in the transmission line, and for obtaining a difference voltage proportional to the difference between the sample voltage and said further voltage, said difference voltage being proportional to the reflected voltage in the transmission line;

means for unloading said voltage dividing means at low frequencies and adding capacitive reactance; and means for deriving the voltage standing wave ratio from said sum voltage and said difference voltage.

10. A bridge circuit for measuring the voltage standing wave ratio on a radio frequency transmission line, said circuit comprising:

means for obtaining a sample voltage proportional to the voltage in the transmission line;

means for inducing a voltage proportional to the current in the transmission line;

voltage dividing means for deriving two equal further voltages proportional to the current in the transmission line;

means for obtaining a sum voltage equal to the sum of the sample voltage and said futher voltage, said sum voltage being proportional to the incident voltage in the transmission line, and for obtaining a difference voltage proportional to the difference between the sample voltage and said further voltage, said difference voltage being proportional to the reflected voltage in the transmission line;

means for adding inductance to said voltage dividing means; and means for deriving the voltage standing wave ratio from said sum voltage and said defference voltage.

11. A circuit for sampling voltages proportional to the incident and reflected voltages on a radio frequency transmission line, said circuit comprising:

means for obtaining a sample voltage proportional to the voltage in the transmission line;

means for inducing a voltage proportional to the current in the transmission line;

means for deriving two equal further voltages proportional to the current in the transmission line, for obtaining a sum voltage equal to the sum of the sample voltage and the further voltage, said sum voltage being proportional to the incident voltage in the transmission line, and for obtaining a difference voltage proportional to the difference between the sample voltage and the further voltage, said difference voltage being proportional to the reflected voltage in the transmission line, said means including voltage dividing means, means for unloading said voltage dividing means at low frequencies and adding capacitive reactance.

12. A circuit for sampling voltages proportional to the incident and reflected voltages on a radio frequency transmission line, said circuit comprising:

means for obtaining a sample voltage proportional to the voltage in the transmission line;

means for inducing a voltage proportional to the current in the transmission line;

voltage dividing means for deriving two equal further voltages proportional to the current in the transmission line, for obtaining a sum voltage equal to the sum of the sample voltage and the further voltage, said sum voltage being proportional to the incident voltage in the transmission line, and for obtaining a difference voltage proportional to the difference between the sample voltage and the further voltage, said difference voltage being proportional to the reflected voltage in the transmission line; and means for adding inductance to said voltage dividing mean.

13. A method of measuring the voltage standing wave ratio on a radio frequency transmission line, comprising:

obtaining a sample voltage proportional to the voltage in the transmission line;

inducing a voltage proportional to the current in the transmission line;

dividing the induced voltage into two equal further voltages;

adding one of said further voltages to said sample voltage to obtain a sum voltage proportional to the incident voltage in the transmission line;

substracting the other of said further voltages from said sample voltage to obtain a difference voltage proportional to the reflected voltage in the transmission line;

adding capactive reactance to said sum and difference voltages at low frequencies in an amount to compensate for the losses and phase lag incurred in inducing the induced voltage; and deriving the voltage standing wave ratio from said sum and difference voltages.

14. A method of measuring the voltage standing wave ratio on a radio frequency transmission line, comprising:

obtaining a sample voltage proportional to the voltage in the transmission line;

inducing a voltage proportional to the current in the transmission line;

dividing the induced voltage into two equal further voltages;

adding one of said further voltages to said sample voltage to obtain a sum voltage proportional to the incident voltage in the transmission line;

subtracting the other of said further voltages from said sample voltage to obtain a difference voltage proportional to the reflected voltage in the transmission line;

adding inductive reactance to said sum and difference voltages in an amount to compensate for the high frequency phase delay incurred in inducing the induced voltage; and deriving the voltage standing wave ratio from said sum and difference voltages.

15. A method of sampling the incident and reflected voltages on a radio frequency transmission line, comprising:

obtaining a sample voltage proportional to the voltage in the transmission line;

inducing a voltage proportional to the current in the transmission line;

dividing the induced voltage into two equal further voltages;

adding one of said further voltages to said sample voltage to obtain a sum voltage proportional to the incident voltage in the transmission line;

subtracting the other of said further voltages from said sample voltage to obtain a difference voltage proportional to the reflected voltage in the transmission line; and adding capacitive reactance to said sum and difference voltages at low frequencies in an amount to compensate for the losses and phase lag incurred in inducing the induced voltage.

16. A method of sampling the incident and reflected voltages on a radio frequency transmission line, comprising:

obtaining a sample voltage proportional to the voltage in the transmission line;

inducing a voltage proportional to the current in the transmission line;

dividing the induced voltage into two equal further voltages;

adding one of said further voltages to said sample voltage to obtain a sum voltage proportional to the incident voltage in the transmission line;

subtracting the other of said further voltages from said sample voltage to obtain a difference voltage proportional to the reflected voltage in the transmission line; and adding inductive reactance to said sum and difference voltages in an amount to compensate for the high frequency phase delay incurred in inducing the induced voltage.

* * * * *